(12) United States Patent
Endo et al.

(10) Patent No.: US 10,823,788 B2
(45) Date of Patent: Nov. 3, 2020

(54) MAGNETIC SENSOR TESTING DEVICE

(71) Applicant: Advantest Corporation, Tokyo (JP)

(72) Inventors: Yuki Endo, Tokyo (JP); Aritomo Kikuchi, Tokyo (JP); Shigeo Nakamura, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 329 days.

(21) Appl. No.: 16/043,396

(22) Filed: Jul. 24, 2018

(65) Prior Publication Data
US 2019/0041470 A1  Feb. 7, 2019

(30) Foreign Application Priority Data

Aug. 4, 2017 (JP) .................. 2017-151260

(51) Int. Cl.
*G01N 27/72* (2006.01)
*G01R 33/00* (2006.01)
*G01R 33/09* (2006.01)
*G01R 33/035* (2006.01)

(52) U.S. Cl.
CPC ..... *G01R 33/0023* (2013.01); *G01R 33/0005* (2013.01); *G01R 33/0354* (2013.01); *G01R 33/09* (2013.01); *G01R 33/093* (2013.01); *H01L 2224/04042* (2013.01); *H01L 2224/45144* (2013.01); *H01L 2924/00* (2013.01); *H01L 2924/14* (2013.01)

(58) Field of Classification Search
CPC ....... H01L 2924/00; H01L 2224/04042; H01L 2224/45144; H01L 2924/14; G01R 33/093; G01R 33/09; G01R 33/0354; G01R 33/0005
USPC ............................ 324/51, 55, 200, 224, 248
See application file for complete search history.

(56) References Cited

U.S. PATENT DOCUMENTS

| 2006/0093880 | A1 | 5/2006 | Igarashi et al. |
| 2018/0106393 | A1* | 4/2018 | Laessler ............. G05D 16/0647 |
| 2018/0165561 | A1* | 6/2018 | Gabriel .............. G06K 7/10356 |
| 2018/0312279 | A1* | 11/2018 | Boyle .................. F16K 31/0651 |

FOREIGN PATENT DOCUMENTS

| JP | H11-339232 A | 12/1999 |
| JP | 2003-207511 A | 7/2003 |
| JP | 2005-338008 A | 12/2005 |
| JP | 2006-134600 A | 5/2006 |

* cited by examiner

*Primary Examiner* — Raul J Rios Russo
(74) *Attorney, Agent, or Firm* — Osha Liang LLP

(57) ABSTRACT

Provided is a magnetic sensor testing device capable of preventing performance of an electromagnet from greatly changing due to heat applied to a magnetic sensor.
A magnetic sensor testing device includes electromagnets 50 and 60 that apply a magnetic field to a magnetic sensor, temperature regulators 30 and 40 that regulate a temperature of the magnetic sensor by locally applying heat to the magnetic sensor, and a controller that controls the electromagnets 50 and 60 and the temperature regulators 30 and 40, in which the controller tests the magnetic sensor in a state in which the magnetic field is applied to the magnetic sensor by the electromagnets 50 and 60 while the heat is applied to the magnetic sensor by the temperature regulators 30 and 40.

9 Claims, 6 Drawing Sheets

US 10,823,788 B2

MAGNETIC SENSOR TESTING DEVICE

TECHNICAL FIELD

The present invention relates to a magnetic sensor testing device.

BACKGROUND ART

There has been a known evaluation device for a magnetoresistance effect element which applies a magnetic field to the magnetoresistance effect element and supplies a predetermined current to the magnetoresistance effect element, thereby evaluating a characteristic of the magnetoresistance effect element. This evaluation device includes a placing table on which the magnetoresistance effect element to be evaluated is placed, magnetic generating means that applies a predetermined magnetic field to the magnetoresistance effect element placed on this placing table, a Peltier element, and a temperature regulator connected to one main surface of the Peltier element via a heat conductor. Further, the Peltier element is disposed so that the main surface of the Peltier element comes into contact with a placing surface of the placing table (for example, see Patent Document 1).

CITATION LIST

Patent Document

Patent Document 1: JP 11-339232 A

SUMMARY OF THE INVENTION

Problem to be Solved by the Invention

In the evaluation device described in Patent Document 1, the magnetoresistance effect element and the magnetic generating means are arranged on the placing table coming into contact with the main surface of the Peltier element. For this reason, when heat is applied to the magnetoresistance element using the Peltier element, heat diffuses on the placing surface, a temperature of the magnetic generating means rises, and there is a possibility that performance of an electromagnet included in the magnetic generating means will greatly change.

A problem to be solved by the invention is to provide a magnetic sensor testing device capable of preventing performance of an electromagnet from greatly changing due to heat applied to a magnetic sensor.

Means for Solving Problem

[1] A magnetic sensor testing device according to the invention includes an electromagnet that applies a magnetic field to a magnetic sensor, a temperature regulator that regulates a temperature of the magnetic sensor by locally applying heat to the magnetic sensor, and a controller that controls the electromagnet and the temperature regulator, in which the controller tests the magnetic sensor in a state in which the magnetic field is applied to the magnetic sensor by the electromagnet while the heat is applied to the magnetic sensor by the temperature regulator.

[2] In the invention, the controller may test the magnetic sensor in a state in which the heat and the magnetic field are changed.

[3] In the invention, the temperature regulator may have a first flow path through which a first refrigerant flows and a second flow path through which a second refrigerant having a different temperature from a temperature of the first refrigerant flows, and the controller may adjust the temperature of the magnetic sensor by controlling a mixing ratio of the first refrigerant and the second refrigerant.

[4] In the invention, the temperature regulator may apply heat to a main surface of the magnetic sensor, and the electromagnet may be provided around the main surface of the magnetic sensor.

[5] In the invention, the magnetic sensor testing device may further include a socket connected to the magnetic sensor, in which a plurality of sockets may have connection surfaces electrically connected to the magnetic sensor, respectively, and be disposed such that the respective connection surfaces are arranged on a plane, and the temperature regulator may apply heat toward the magnetic sensor from above or below the connection surfaces.

[6] In the invention, the temperature regulator may be in contact with the main surface of the magnetic sensor.

[7] In the invention, the electromagnet may have a core, a main coil wound around the core, and a correction coil for correcting the magnetic field.

[8] In the invention, the magnetic sensor testing device may further include a magnetic field measurement sensor that measures the magnetic field, in which the controller may control an input current to the correction coil based on the magnetic field measured by the magnetic field measurement sensor.

[9] In the invention, the controller may control an input current pulse to the correction coil according to the magnetic field measured by the magnetic field measurement sensor.

Effect of the Invention

According to the invention, heat is locally applied to a magnetic sensor using a temperature regulator while a magnetic field is applied to the magnetic sensor using an electromagnet to test the magnetic sensor under a predetermined temperature condition and magnetic field condition, and thus it is possible to prevent performance of the electromagnet from greatly changing due to heat applied to the magnetic sensor.

MODE(S) FOR CARRYING OUT THE INVENTION

Figure 1:
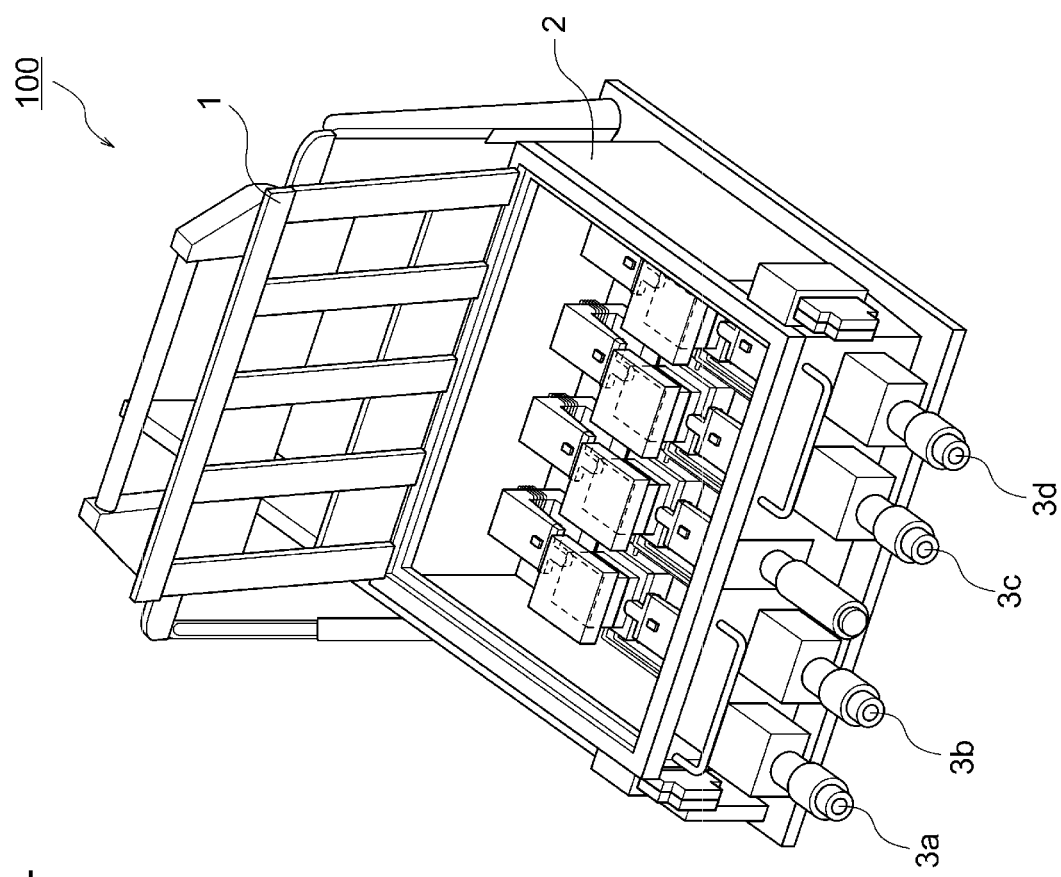
FIG. 1 is a perspective view of a magnetic sensor testing device according to an embodiment of the invention.
Figure 2:
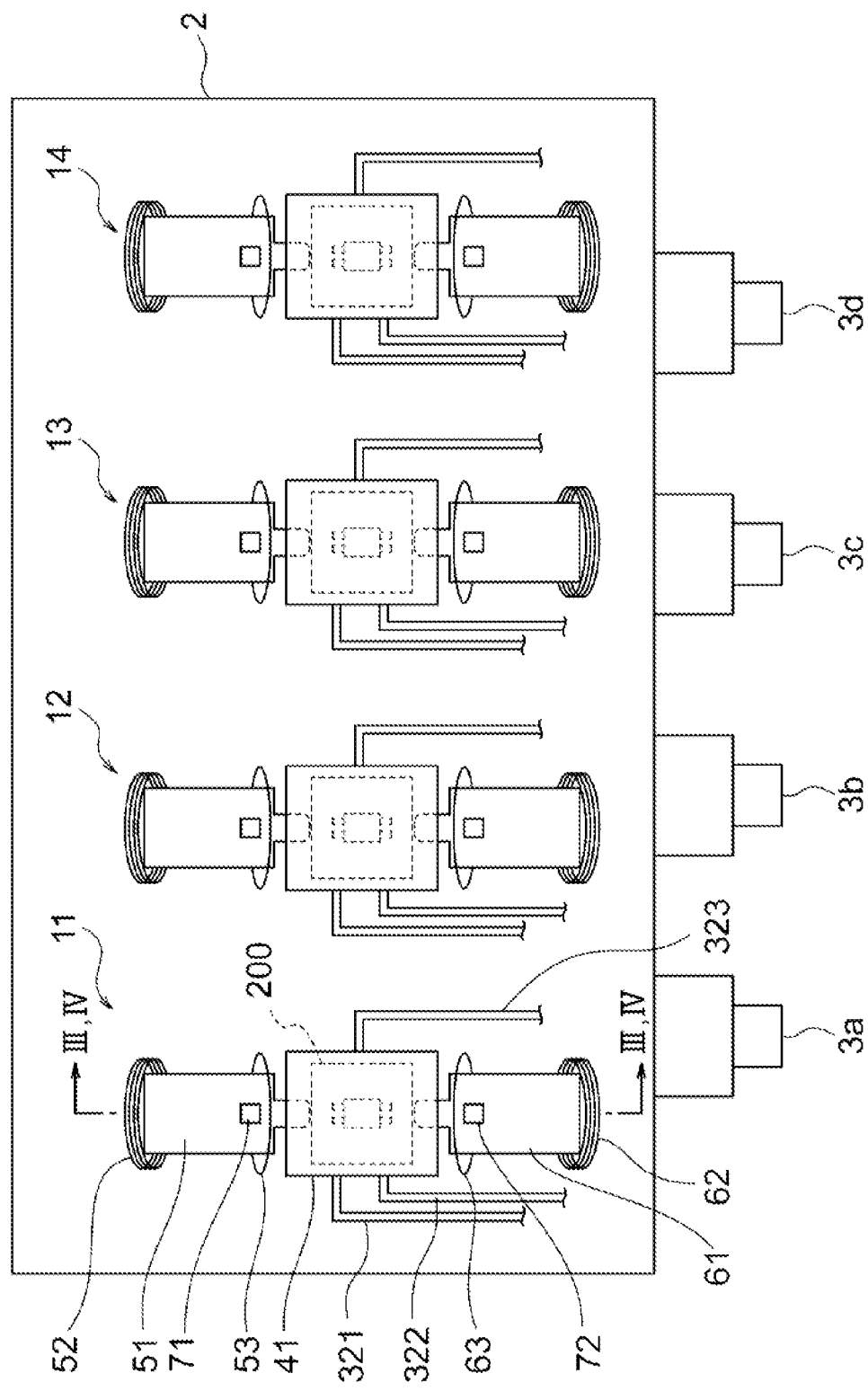
FIG. 2 is a plan view of a state in which a lid is removed in the magnetic sensor testing device of FIG. 1.
Figure 3:
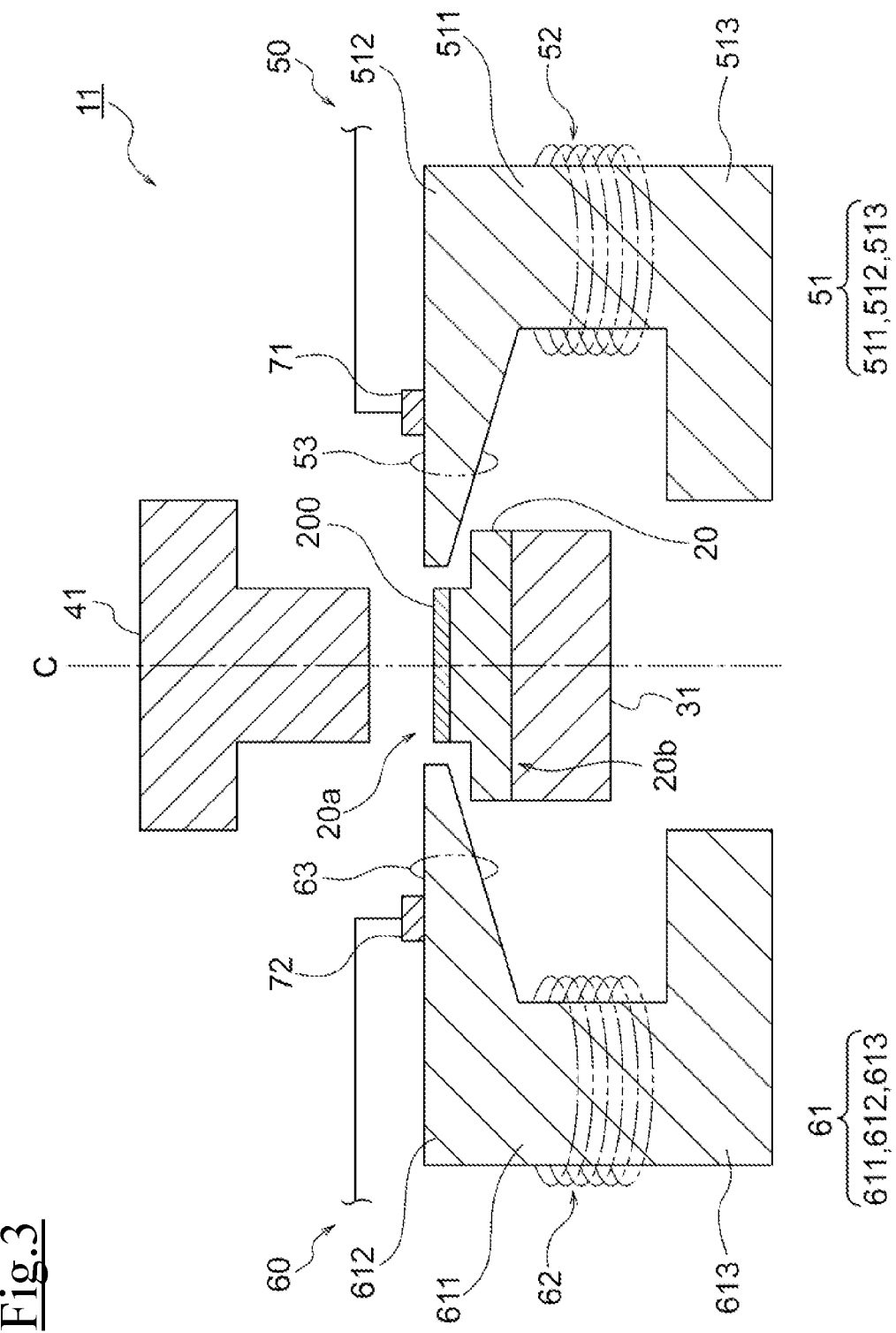
FIG. 3 is a cross-sectional view taken along III-III line of FIG. 2.
Figure 4:
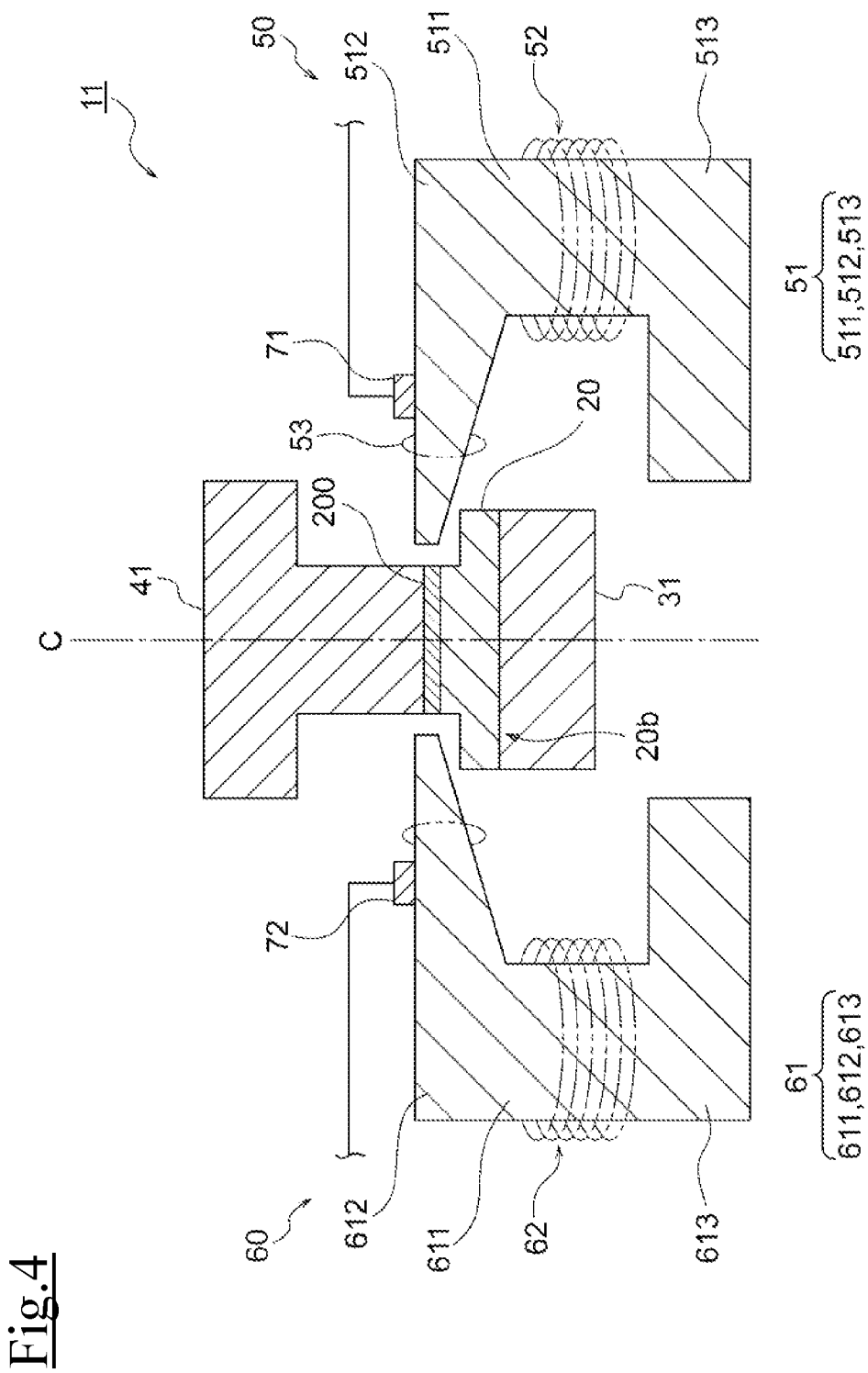
FIG. 4 is a cross-sectional view taken along IV-IV line of FIG. 2.

Hereinafter, an embodiment of the invention will be described with reference to drawings. FIG. 1 is a perspective view of a magnetic sensor testing device according to an embodiment of the invention. FIG. 2 is a plan view of a state in which a lid is removed in the magnetic sensor testing device of FIG. 1. FIG. 3 and FIG. 4 are cross-sectional views taken along III-III line of FIG. 2.

The magnetic sensor testing device illustrated in FIG. 1 applies heat and a magnetic field to a magnetic sensor, and tests (inspects) whether the magnetic sensor properly operates in this state. The magnetic sensor testing device tests a sensor having a magnetic measuring element such as a current sensor.

As illustrated in FIG. 1, a magnetic sensor testing device 100 includes a housing 1 that houses a component of the testing device, a lid 2 that covers an opening of the housing 1, and refrigerant pipes 3a to 3d that pass refrigerant. Test mechanisms 11 to 14 for holding the magnetic sensor corresponding to a device under test and testing the magnetic sensor are provided inside the housing. The magnetic sensor testing device 100 is configured so that heat can be directly applied to the magnetic sensor in a state in which a magnetic field is applied to the magnetic sensor.

The housing 1 is a case made of metal and is formed in a rectangular shape with an upper surface opened. The lid is a metal plate-shaped member and covers the opening of the housing 1. The refrigerant pipes 3a to 3d are connected to temperature regulators 30 and 40 included in the test mechanisms 11 to 14 to supply refrigerant to the temperature regulators 30 and 40 and discharge refrigerant from the temperature regulators 30 and 40. The refrigerant pipes 3a to 3d are connected to a refrigerant container not illustrated in FIG. 1.

Hereinafter, specific configurations of the test mechanisms 11 to 14 will be described with reference to FIGS. 2 to 4. As illustrated in FIG. 2, the test mechanisms 11 to 14 are arranged in a row in the housing 1. The test mechanisms 11 to 14 are configured so that heat applied to the magnetic sensor and a magnetic field applied to the magnetic sensor can be independently adjusted for each of the test mechanisms 11 to 14. The respective configurations of the test mechanisms 11 to 14 are the same. Hereinafter, the configuration of the test mechanism 11 will be described, and description of the configurations of the test mechanisms 12 to 14 will be omitted.

The test mechanism 11 includes a socket 20, the temperature regulators 30 and 40, electromagnets 50 and 60, and sensors 71 and 72. The socket 20 comes into contact with a magnetic sensor 200 to hold the magnetic sensor 200 while being electrically connected to the magnetic sensor 200. A pin for contact with the magnetic sensor 200 is provided on a top surface 20a of the socket 20. That is, the top surface 20a of the socket 20 corresponds to a connection surface for electric connection with the magnetic sensor 200. The socket 20 has a signal line electrically connected to the pin. The socket 20 is connected to a controller 80 described below via a cable (not illustrated). In a state in which the magnetic sensor 200 is connected to the socket 20, an electric signal from the controller 80 is given to the magnetic sensor 200 via the socket 20, and the magnetic sensor 200 is tested based on a signal output from the magnetic sensor 200. Respective sockets 20 included in the test mechanisms 11 to 14 are disposed so that respective connection surfaces 20a are arranged on a plane.

A heat generator (thermal chuck) 31 is provided on a bottom surface 20b of the socket 20. The heat generator 31 is a part of a configuration of the temperature regulator 30, and the temperature regulator 30 outputs heat from the heat generator 31 and applies heat from below the magnetic sensor 200 via the socket 20. For this reason, the socket 20 is formed of a material having high thermal conductivity. A shape of the top surface 20a of the socket 20 is the same as a shape of the bottom surface of the magnetic sensor 200 so that heat from the heat generator 31 is prevented from spreading to the electromagnets 50 and 60 through the socket 20. That is, it is preferable that the top surface 20a of the socket 20 is not disposed immediately below the electromagnets 50 and 60.

The temperature regulator 30 locally applies heat to the magnetic sensor 200 from below the magnetic sensor 200 to regulate the temperature of the magnetic sensor 200. The temperature regulator 40 locally applies heat to the magnetic sensor 200 from above the magnetic sensor to regulate the temperature of the magnetic sensor 200.

Figure 5:
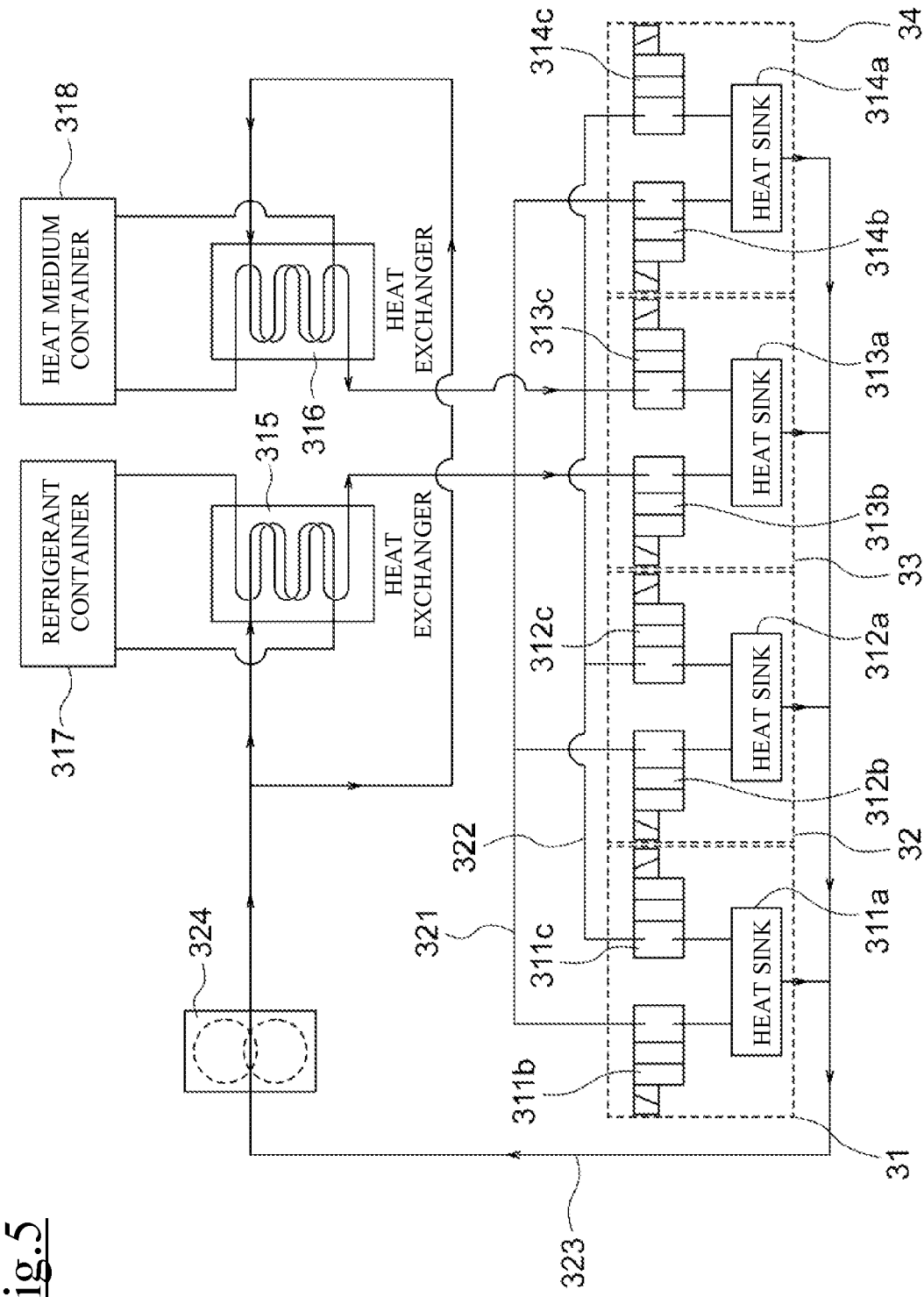
FIG. 5 is a block diagram of a temperature regulator illustrated in FIG. 2.

Here, configurations of the temperature regulators 30 and 40 will be described with reference to FIG. 5. FIG. 5 is a block diagram of the temperature regulator 30. A basic configuration of the temperature regulator 40 is the same as a configuration of the temperature regulator 30, and thus description thereof will be omitted.

As illustrated in FIG. 5, the temperature regulator 30 includes heat generators 31 to 34, heat exchangers 315 and 316, a refrigerant container 317, a heat medium container 318, flow paths 321 to 323, and a pump 324. The temperature regulator 30 supplies a refrigerant discharged from the heat exchanger 315 and a heat medium discharged from the heat exchanger 316 to each of the four heat generators 31 to 34. The temperature regulator 30 may individually regulate temperatures by mixing the refrigerant and the heat medium and changing a mixing ratio in the four heat generators 31 to 34. That is, the temperature regulator 30 is a device that locally applies a temperature to the magnetic sensor 200 using a plurality of refrigerants having different temperatures.

The heat generator 31 includes a heat sink 311a and valves 311b and 311c. The heat sink 311a is a component that directly applies heat to the magnetic sensor 200, and is a portion in direction contact with the bottom surface of the socket 20. In the case of the temperature regulator 40 that applies heat from above the magnetic sensor 200, a heat generator 41 is in direct contact with the top surface of the magnetic sensor 200. The valve 311b adjusts a supply amount of the refrigerant. The valve 311c adjusts a supply amount of the heat medium. An inside of the heat sink 311a has a structure in which the refrigerant and the heat medium may be mixed. Further, the refrigerant mixed in the heat sink 311a passes through the flow path 323 and returns to the heat exchangers 315 and 316.

The heat generator 32 includes a heat sink 312a and valves 312b and 312c, the heat generator 33 includes a heat sink 313a and valves 313b and 313c, and the heat generator 34 includes a heat sink 314a and valves 314b and 314c. The valves 311b, 312b, 313b, and 314b are valves for the refrigerant, and the valves 311c, 312c, 313c, and 314c are valves for the heat medium.

The heat exchanger 315 has a flow path for flowing the refrigerant supplied from the refrigerant container 317 and a flow path for flowing the refrigerant to the heat generators 31 to 34, and lowers a temperature of the refrigerant by heat exchange between the flow paths. The heat exchanger 316 has a flow path for flowing the heat medium supplied from the heat medium container 318 and a flow path for flowing the heat medium to the heat generators 31 to 34, and increases a temperature of the heat medium by heat exchange between the flow paths. The heat exchanger 315 and the valves 311b, 312b, 313b, and 314b are connected by the refrigerant flow path 321, and the heat exchanger 316 and the valves 311c, 312c, 313c, and 314c are connected by the heat medium flow path 322. The flow path 321 branches to flow the refrigerant output from the heat exchanger 315 to the four heat generators 31 to 34. Similarly, the flow path 322 branches to flow the heat medium output from the heat exchanger 316 to the four heat generators 31 to 34. The heat sinks 311a to 314a and the heat exchangers 315 and 316 are connected by the flow path 323 so that the refrigerant mixed in the heat sinks 311a to 314a flows to the heat exchangers 315 and 316. The flow path 323 branches into two flow paths so that refrigerants output from the heat sinks 311a to 314a are merged into one flow path and the merged refrigerant flows to the heat exchanger 315 and the heat exchanger 316. The pump 324 is connected to the flow path 323.

The temperature regulators 30 and 40 may have regulators, etc. in addition to the above-described configurations of the heat generators 31 to 34, etc. FIG. 5 is merely an example of the configurations of the temperature regulators 30 and 40, and the temperature regulators 30 and 40 may have other configurations.

As illustrated in FIG. 3 and FIG. 4, the heat generator 31 is provided below the socket 20, and the top surface of the heat generator 31 and the bottom surface of the socket 20 are in direct contact. The heat generator 41 is provided above the magnetic sensor 200. The heat generator 41 is movable in a normal direction of the connection surface of the socket 20. As illustrated in FIG. 3, when the magnetic sensor 200 is connected to the socket 20, the heat generator 41 is positioned above the magnetic sensor 200. As illustrated in FIG. 4, after the magnetic sensor 200 is connected to the socket 20, the heat generator 41 moves downward to approach the magnetic sensor 200, and the bottom surface of the heat generator 41 is in direct contact with the top surface of the magnetic sensor 200. When the heat generator 41 touches the magnetic sensor 200, a heat sinking plane for heat of the heat generator 41 overlaps the top surface of the magnetic sensor 200. Further, to prevent heat from the heat sinking plane of the heat generator 41 from conducting to the outside other than the magnetic sensor 200, the shape of the bottom surface of the heat generator 41 and the shape of the top surface of the magnetic sensor 200 are set to the same shape.

The electromagnets 50 and 60 apply a magnetic field to the magnetic sensor 200. The electromagnet 50 and the electromagnet 60 form a pair of electromagnets, the electromagnet 50 is located on a right side in a cross section of the test mechanism 11, and the electromagnet 60 is located on a left side in the cross section of the test mechanism 11. The electromagnet 50 has a core 51, a main coil 52, and a correction coil 53. The electromagnet 60 has a core 61, a main coil 62, and a correction coil 63. The cores 51 and 61 correspond to ferrite (iron cores) for strengthening a magnetic flux generated in the main coils 52 and 62 and passing a closed loop (magnetic circuit) formed by the magnetic flux through the magnetic sensor 200.

Respective configurations of the core 61, the main coil 62, and the correction coil 63 are the same as respective configurations of the core 51, the main coil 52, and the correction coil 53. In addition, as illustrated in FIG. 3 and FIG. 4, in the cross section of the test mechanism 11, the core 51, the main coil 52, the correction coil 53, the core 61, the main coil 62, and the correction coil 63 are disposed to be point-symmetric with respect to a central axis C. The central axis C is a line along the normal direction of the connection surface of the socket 20.

The core 51 has a main body 511 around which the main coil 52 is wound, an extending portion 512 extending from the main body 511 toward the magnetic sensor 200, and a bottom portion 513 located below the main body 511. The main body 511, the extending portion 512, and the bottom portion 513 are integrated. The main body 511 is formed in a columnar shape. The main body 511 and a main body 611 are disposed so that central axes of columnar shapes are parallel to the central axis C and the heat generator 31 is interposed therebetween. The extending portion 512 extends from an upper surface of the main body 511 such that a distal end approaches a side surface of the magnetic sensor 200. The extending portion 512 is formed in a tapered shape, and a pointed portion of a tip is disposed on the side surface of the magnetic sensor 200. That is, around the magnetic sensor 200, the heat generator 31 is located on the bottom surface of the magnetic sensor 200 (a lower main surface of the magnetic sensor 200), the heat generator 41 is located on the top surface of the magnetic sensor 200 (an upper main surface of the magnetic sensor 200), and the distal end of the extending portion 512 and a distal end of an extending portion 612 are located around the main surface of the magnetic sensor 200.

The main coil 52 is a conducting wire wound around the main body 511. When currents flow through the main coils 52 and 62 under the control of the controller 80 described below, a magnetic flux is generated and the magnetic flux passes in a closed loop shape closed by the main body 511, the extending portion 512, the magnetic sensor 200, the extending portion 612, the main body 611, a bottom portion 613, and the bottom portion 513.

The correction coil 53 is a conducting wire wound around the distal end of the extending portion 512. The number of turns of the correction coil 53 is smaller than the number of turns of the main coil 52. The correction coils 53 and 63 are coils for correcting magnetic fields generated by the electromagnets 50 and 60. When currents flow to the correction coils 53 and 63 in a state in which currents flow to the main coils 52 and 62 and magnetic fields are generated, magnetic fields generated by the correction coils 53 and 63 are added to the magnetic fields generated by the main coils 52 and 62. Since the magnetic fields generated by the correction coils 53 and 63 are smaller than the magnetic fields generated by the main coils 52 and 62, magnetic fields of the electromagnets 50 and 60 are adjusted by controlling the currents flowing to the main coils 52 and 62, and the magnetic fields of the electromagnets 50 and 60 are corrected by controlling the currents flowing to the correction coils 53 and 63.

The sensors 71 and 72 measure the magnetic fields generated by the electromagnets 50 and 60. The sensor 71 is provided in the core 51, and the sensor 72 is provided in the core 61. Detected values of the sensors 71 and 72 are output to the controller 80.

Figure 6:
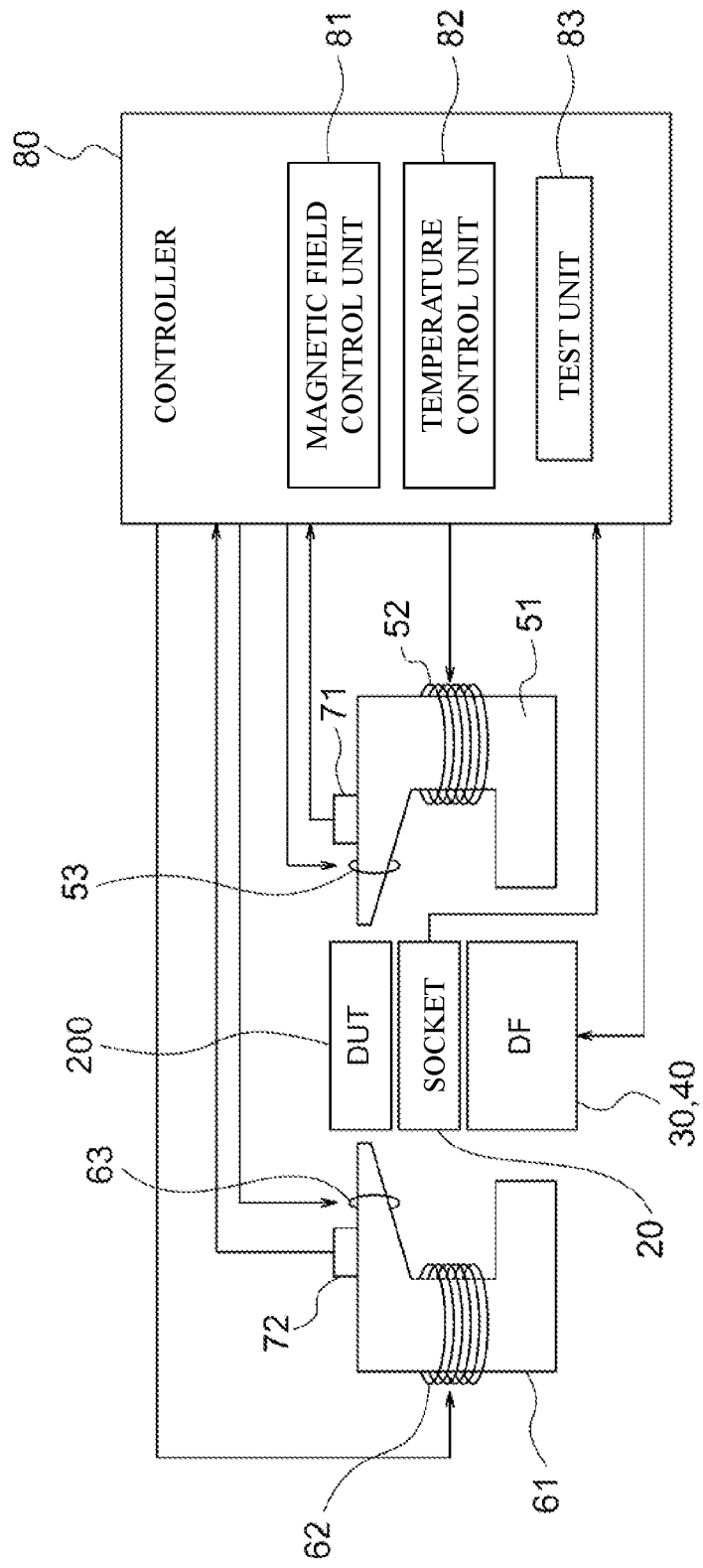
FIG. 6 is a block diagram of the magnetic sensor testing device according to the embodiment of the invention.

Next, control of the controller 80 will be described with reference to FIG. 6. FIG. 6 is a block diagram of the magnetic sensor testing device. A device under test (DUT) 200 corresponds to the magnetic sensor. Dual fluids (DF) 30 and 40 correspond to the temperature regulators.

The controller 80 is a controller that controls the entire magnetic sensor testing device, and has a CPU, a RAM, a ROM, etc. The controller 80 has a magnetic field control function for controlling a magnetic field applied to the magnetic sensor 200, a temperature control function for controlling a temperature of the magnetic sensor 200, and a test function for testing the magnetic sensor 200. The controller 80 includes a magnetic field control unit 81, a temperature control unit 82, and a test unit 83 as functional blocks for executing the respective functions. The controller 80 stores software for executing the respective functions in the ROM, etc., and operates the respective functional blocks by executing the software using the CPU.

The magnetic field control unit 81 calculates a target value of a magnetic field applied to the magnetic sensor 200 and causes a current corresponding to the target value to flow through the main coils 52 and 62 included in the electromagnets 50 and 60 to generate magnetic fields in the electromagnets 50 and 60. In addition, the magnetic field control unit 81 detects the magnetic fields generated by the electromagnets 50 and 60 using the sensors 71 and 72. Detected values of the sensors 71 and 72 return to the controller 80, and the magnetic field control unit 81 calculates a correction current for generating a magnetic flux corresponding to a difference between an actual magnetic flux detected by each of the sensors 71 and 72 and the target value from the difference. The correction current is represented by an input current pulse to each of the correction coils 53 and 63. The magnetic field control unit 81 adjusts the magnitude of the magnetic flux by the number of pulses of the input current pulse. The magnetic field control unit 81 inputs the input current pulse corresponding to the correction current to each of the correction coils 53 and 63 and applies a correction magnetic field to the magnetic field generated by each of the main coils 52 and 62. That is, the magnetic field control unit 81 generates magnetic fields in the electromagnets 50 and 60 by current control of the main coils 52 and 62, and adjusts the magnetic fields of the electromagnets 50 and 60 by feedback control using the sensors 71 and 72. In this instance, adjustment of the magnetic fields by the feedback control is performed by controlling the input current pulse to each of the correction coils 53 and 63. Since windings of the correction coils 53 and 63 are smaller than windings of the main coils 52 and 62 and adjustment of the current is executed by pulse input, the magnetic flux can be more precisely adjusted.

The temperature control unit 82 sets a flow rate of the refrigerant and a flow rate of the heat medium so that the temperature of the magnetic sensor 200 becomes a set temperature. The set temperature is a temperature specified by the user when the magnetic sensor 200 is tested. The temperature control unit 82 sets opening and closing amounts and opening and closing times of the valves 311*b*, 312*b*, 313*b*, and 314*b* and the valves 311*c*, 312*c*, 313*c*, and 314*c* according to the set flow rate of the refrigerant and the set flow rate of the heat medium, and operates the valves 311*b*, 312*b*, 313*b*, and 314*b* and the valves 311*c*, 312*c*, 313*c*, and 314*c*.

The test unit 83 tests the magnetic sensor 200 in a state in which the magnetic fields generated by the electromagnets 50 and 60 are applied to the magnetic sensor 200, heat is applied to the magnetic sensor 200 by the temperature regulators 30 and 40, and the temperature of the magnetic sensor 200 is kept at a test temperature. The test unit 83 tests the magnetic sensor 200 by inputting an electric signal to the magnetic sensor 200 and evaluating a response signal from the magnetic sensor 200.

As described above, the magnetic sensor testing device according to the present embodiment includes the electromagnets 50 and 60 that apply magnetic fields to the magnetic sensor 200 and the temperature regulators 30 and 40 that locally apply heat to the magnetic sensor 200 to adjust the temperature of the magnetic sensor, and tests the magnetic sensor 200 in a state in which the magnetic fields are applied to the magnetic sensor 200 by the electromagnets 50 and 60 while heat is applied to the magnetic sensor 200 by the temperature regulators 30 and 40. In this way, it is possible to inhibit performance of the electromagnets 50 and 60 from being greatly changed by heat applied to the magnetic sensor 200 from the temperature regulators 30 and 40. In addition, since the temperature regulators 30 and 40 can locally apply heat to the magnetic sensor 200, the electromagnets 50 and 60 can be operated in a normal temperature state or a non-high temperature state. Since it is only necessary to use a temperature regulator that is guaranteed to operate under a temperature condition such as at room temperature, it is possible to omit a compensation circuit, etc.

Meanwhile, a device for putting a test mechanism including a Helmholtz coil in a thermostatic bath is considered as a device for testing the magnetic sensor 200 in a state in which heat and a magnetic field are applied to the magnetic sensor 200. In such a device, a pair of large-sized coils is disposed to interpose a socket for connecting the magnetic sensor 200 therebetween, and the socket and the pair of coils are put into the thermostatic bath. Heat generated in the thermostatic bath is applied not only to the magnetic sensor 200 but also to the pair of coils. For this reason, a magnetic field generated by the coils is affected by a temperature, and thus there is a problem that evaluation accuracy of the magnetic sensor 200 is lowered. In addition, it is conceivable to use an electromagnet inside the thermostatic bath as a mechanism for generating a magnetic field. However, since the electromagnet has temperature dependency, there is a problem that a magnetic field characteristic greatly changes depending on the temperature of the thermostatic bath. Furthermore, when the temperature of the thermostatic bath is high, there is a possibility that the temperature of the electromagnet will exceed the Curie temperature. In order to avoid such electromagnet problems, there is a method of using the Helmholtz coil inside the thermostatic bath as described above. However, there is another problem that the device increases in size.

The magnetic sensor testing device according to the present embodiment provides flow paths for flowing refrigerants having different temperatures in the temperature regulators 30 and 40, and controls a mixing ratio of the refrigerants, thereby setting the temperature of the magnetic sensor 200. In this way, heat can be applied to a specific part of the magnetic sensor 200, and heat can be prevented from being distributed over a wide range. As a result, it is possible to operate the electromagnets 50 and 60 at an appropriate temperature. Further, since the electromagnets 50 and 60 can be disposed near the socket 20, efficiency of the magnetism applied to the magnetic sensor 200 can be increased during the test.

In addition, in the magnetic sensor testing device according to the present embodiment, the magnetic sensor 200 is tested in a state in which the heat and the magnetic field applied to the magnetic sensor 200 are changed. In this way, it is possible to detect a defect of a sensor that does not normally operate at some temperatures or some magnetic flux strengths. For example, when the magnetic sensor 200 normally operates at −40 degrees and does not normally operate at +20 degrees due to a defect in a correction circuit inside the magnetic sensor 200, the magnetic sensor testing device according to the present embodiment may detect abnormality of the sensor by testing the magnetic sensor 200 while changing the temperature within a temperature range including at least −40 degrees and +20 degrees. In addition, for example, when the operation is normal at a magnetic flux of 40 mT and the operation is abnormal a magnetic flux of 10 mT due to a defect in an AD conversion circuit inside the magnetic sensor, the magnetic sensor testing device according to the present embodiment may detect abnormality of the sensor by testing the magnetic sensor 200 while changing the magnetic field within a magnetic flux range including at least 10 mT and 40 mT. In addition, in the case of testing the sensor under different temperature conditions and different magnetic flux conditions, in the magnetic sensor testing device according to the present embodiment, the temperature and the magnetic field may be appropriately changed through temperature adjustment by the temperature regulators 30 and 40 and magnetic field adjustment by the electromagnets 50 and 60, and thus it is possible to shorten a test time and reduce a temperature test path.

In addition, in the magnetic sensor testing device according to the present embodiment, heat is applied to the main surface of the magnetic sensor 200 by the temperature regulators 30 and 40, and the electromagnets 50 and 60 are provided around the main surface of the magnetic sensor 200. In this way, it is possible to increase efficiency of the magnetism applied to the magnetic sensor 200.

In addition, in the magnetic sensor testing device according to the present embodiment, the respective connection surfaces of the plurality of sockets 20 are arranged on a plane, and the temperature regulators 30 and 40 apply heat to the magnetic sensor 200 from above or below the connection surfaces of the sockets 20. In this way, the magnetic sensor 200 may be tested while applying different magnetic fields or different temperatures to the magnetic sensor 200 connected to the plurality of sockets 20. In addition, in the case of applying heat to the magnetic sensor 200 using the thermostatic bath unlike the present embodiment, respective temperatures of a plurality of magnetic sensors 200 may not be individually changed. However, in the magnetic sensor testing device according to the present embodiment, respective temperatures of the magnetic sensors 200 may be individually changed.

In addition, the magnetic sensor testing device according to the present embodiment controls an input current to the correction coil based on magnetic fields measured by the magnetic field measurement sensors 71 and 72. In this way, a magnetic flux is adjusted by FB control, and thus it is possible to enhance followability of the magnetic flux to the target value.

In addition, the magnetic sensor testing device according to the present embodiment controls input current pulses to the correction coils 53 and 63 according to the magnetic fields measured by the magnetic field measurement sensors 71 and 72. In this way, it is possible to finely set a magnetic flux applied to the magnetic sensor 200.

In the present embodiment, the temperature regulators 30 and 40 adjust the temperature of the magnetic sensor 200 using refrigerants having different temperatures. However, the temperature of the magnetic sensor 200 may be adjusted using a heat gun, etc.

The embodiment described above is described to facilitate understanding of the invention and is not described to limit the invention. Therefore, each element disclosed in the above embodiment includes all design changes and equivalents belonging to the technical scope of the invention.

EXPLANATIONS OF LETTERS OR NUMERALS 1 housing
2 lid
3a to 3d refrigerant pipe
11, 12, 13, 14 test mechanism
20 socket
30 temperature regulator
40 temperature regulator
50 electromagnet
51 core
52 main coil
53 correction coil
60 electromagnet
61 core
62 main coil
63 correction coil
71, 72 magnetic field measurement sensor
72 sensor
80 controller
81 magnetic field control unit
82 temperature control unit
83 test unit
100 magnetic sensor testing device
200 magnetic sensor

The invention claimed is:

1. A magnetic sensor testing device comprising:
   an electromagnet that applies a magnetic field to a magnetic sensor;
   a temperature regulator that regulates a temperature of the magnetic sensor by locally applying heat to the magnetic sensor; and
   a controller that controls the electromagnet and the temperature regulator,
   wherein the controller tests the magnetic sensor in a state in which the magnetic field is applied to the magnetic sensor by the electromagnet while the heat is applied to the magnetic sensor by the temperature regulator.

2. The magnetic sensor testing device according to claim 1, wherein the controller tests the magnetic sensor in a state in which the heat and the magnetic field are changed.

3. The magnetic sensor testing device according to claim 1,
   wherein the temperature regulator has a first flow path through which a first refrigerant flows and a second flow path through which a second refrigerant flows,
   the second refrigerant has a different temperature from a temperature of the first refrigerant, and
   the controller adjusts the temperature of the magnetic sensor by controlling a mixing ratio of the first refrigerant and the second refrigerant.

4. The magnetic sensor testing device according to claim 1,
   wherein the temperature regulator applies heat to a main surface of the magnetic sensor, and
   the electromagnet is provided around the main surface of the magnetic sensor.

5. The magnetic sensor testing device according to claim 1, further comprising
   a socket connected to the magnetic sensor,
   wherein a plurality of the sockets has connection surfaces electrically connected to the magnetic sensor, respectively, and is disposed such that the respective connection surfaces are arranged on a plane, and
   the temperature regulator applies heat toward the magnetic sensor from above or below the connection surfaces.

6. The magnetic sensor testing device according to claim 1, wherein the temperature regulator is in contact with a main surface of the magnetic sensor.

7. The magnetic sensor testing device according to claim 1, wherein the electromagnet has a core, a main coil wound around the core, and a correction coil for correcting the magnetic field.

8. The magnetic sensor testing device according to claim 7, further comprising
   a magnetic field measurement sensor that measures the magnetic field,
   wherein the controller controls an input current to the correction coil based on the magnetic field measured by the magnetic field measurement sensor.

9. The magnetic sensor testing device according to claim 7, further comprising
a magnetic field measurement sensor that measures the magnetic field,
wherein the controller
controls an input current pulse to the correction coil according to the magnetic field measured by the magnetic field measurement sensor.

* * * * *